United States Patent
Subramanian et al.

(10) Patent No.: US 6,371,134 B2
(45) Date of Patent: *Apr. 16, 2002

(54) OZONE CLEANING OF WAFERS

(75) Inventors: Ramkumar Subramanian; Khoi A. Phan, both of San Jose; Bharath Rangarajan, Santa Clara; Bhanwar Singh, Morgan Hill; Sanjay K. Yedur, Santa Clara; Bryan K. Choo, Mountain View, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/495,014

(22) Filed: Jan. 31, 2000

(51) Int. Cl.$^7$ .............................. B08B 7/00; B08B 7/04
(52) U.S. Cl. .................... 134/1.2; 134/1.1; 134/1.3; 134/26; 134/29
(58) Field of Search ................ 134/1.1, 1.2, 1.3, 134/26, 29; 216/48, 55, 62, 67; 438/723, 710, 694, 592, 738, 742

(56) References Cited

U.S. PATENT DOCUMENTS

| | | | | |
|---|---|---|---|---|
| 5,346,586 A | * | 9/1994 | Keller | |
| 5,356,478 A | | 10/1994 | Chen et al. | 134/1 |
| 5,423,944 A | | 6/1995 | Wong | 156/646.1 |
| 5,445,699 A | * | 8/1995 | Kamikawa et al. | 156/345 |
| 5,486,267 A | * | 1/1996 | Knight et al. | |
| 5,712,198 A | | 1/1998 | Shive et al. | 437/235 |
| 5,780,406 A | * | 7/1998 | Honda et al. | 134/1.3 X |
| 5,944,907 A | | 8/1999 | Ohmi | 134/1.3 |
| 6,024,887 A | * | 2/2000 | Kuo et al. | 216/48 |
| 6,030,932 A | * | 2/2000 | Leon et al. | 510/175 |

FOREIGN PATENT DOCUMENTS

JP          4-75324      *    3/1992

* cited by examiner

*Primary Examiner*—Alexander Markoff
(74) *Attorney, Agent, or Firm*—Amin & Turocy, LLP

(57) ABSTRACT

In one embodiment, the present invention relates to a method of processing a semiconductor structure, involving the steps of providing the semiconductor structure having a patterned resist thereon; stripping the patterned resist from the semiconductor structure, wherein an amount of carbon containing resist debris remain on the semiconductor structure; and contacting the semiconductor structure with ozone thereby reducing the amount of carbon containing resist debris thereon.

18 Claims, No Drawings

OZONE CLEANING OF WAFERS

TECHNICAL FIELD

The present invention generally relates to improved lithography processing. In particular, the present invention relates to reducing resist debris on semiconductor substrates using ozone.

BACKGROUND ART

Microlithography processes for making miniaturized electronic components, such as in the fabrication of computer chips and integrated circuits, are of increasing importance as the trend towards miniaturization and integration continues. Lithography involves the use of resists to temporarily mask a semiconductor substrate surface to enable site specific additive, subtractive, or enhancing processing (e.g., deposition, etching, doping). Lithography specifically involves applying a coating or film of a resist to a substrate material, such as a silicon wafer used for making integrated circuits. The substrate may contain any number of layers or devices thereon.

The resist coated substrate is baked to evaporate any solvent in the resist composition and to fix the resist coating onto the substrate. The baked coated surface of the substrate is next subjected to selective radiation; that is, an imagewise exposure to radiation. This radiation exposure causes a chemical transformation in the exposed areas of the resist coated surface. Types of radiation commonly used in microlithographic processes include visible light, ultraviolet (UV) light and electron beam radiant energy. After selective exposure, the resist coated substrate is treated with a developer solution to dissolve and remove either the radiation-exposed or the unexposed areas of the resist (depending upon whether a positive resist or a negative resist is utilized) resulting in a patterned or developed resist. Many developer solutions contain water and a base, such as water and a hydroxide compound.

Treating a selectively exposed resist with a developer conventionally involves depositing the liquid developer solution over the resist clad substrate and spinning the substrate whereby the liquid developer solution and dissolved areas of the resist are removed from the substrate by centrifugal forces. A rinsing solution, typically deionized water, is then deposited over the resist clad substrate and the substrate is spun again to remove the water and any debris solubilized by the water. Spinning the substrate is a convenient and inexpensive method of removing materials from substrate.

The patterned resist covered substrate is then subject to standard semiconductor processing such as material deposition, etching, or doping. Since the patterned resist only covers a portion of the substrate, the standard semiconductor processing techniques impact desired areas of the substrate. This is the basis for fabricating integrated circuit chips.

After standard semiconductor processing (material deposition, etching, or doping) is completed, the patterned resist is removed or stripped from the substrate. This process is repeated numerous times until a desired product is obtained. However, it is important to completely remove the patterned resist from the substrate in order to prevent defects in the desired product (that is, deleteriously affect subsequent processing).

On one hand, there is a desire for a stripper to completely remove a patterned resist after standard semiconductor processing. Although it is difficult if not impossible to completely remove a patterned resist from a substrate, efforts in this direction involve the use of aggressive strippers. On the other hand, there is a desire for a stripper not to damage the underlying substrate while removing the patterned resist. Efforts in this direction involve using strippers that require undesirably long processing times. One problem associated with lithography, therefore, is using a stripper that completely removes a patterned resist without damaging the underlying substrate in a reasonable period of time. Such a stripper is presently desired. In lieu of such a stripper, alternative methods may be employed.

SUMMARY OF THE INVENTION

The present invention provides an improved cleaning process in connection with lithography. The present invention also provides methods for minimizing the presence of resist debris on resist developed and stripped semiconductor substrates. As a result of the present invention, post-lithography semiconductor processing is substantially improved.

In one embodiment, the present invention relates to a method of processing a semiconductor structure, involving the steps of providing the semiconductor structure having a patterned resist thereon; stripping the patterned resist from the semiconductor structure, wherein an amount of carbon containing resist debris remain on the semiconductor structure; and contacting the semiconductor structure with ozone thereby reducing the amount of carbon containing resist debris thereon.

In another embodiment, the present invention relates to a method of reducing carbon containing resist debris on a patterned resist stripped semiconductor structure, involving the steps of providing a semiconductor structure having a patterned resist thereon, the patterned resist comprising a carbon containing material; stripping the patterned resist from the semiconductor structure, wherein an amount of carbon containing resist debris remain on the semiconductor structure; contacting the patterned resist stripped semiconductor structure with at least one of a gas and a plasma comprising ozone and at least one inert gas thereby reducing the amount of carbon containing resist debris thereon; and rinsing the semiconductor structure.

In yet another embodiment, the present invention relates to a method of processing a semiconductor structure, involving the steps of providing the semiconductor structure having a patterned resist thereon, the patterned resist comprising a carbon containing material; stripping the patterned resist from the semiconductor structure, wherein an amount of carbon containing resist debris remain on the semiconductor structure; and contacting the semiconductor structure with at least one of a gas and a plasma consisting essentially of ozone and at least one inert gas selected from nitrogen, helium, and argon thereby reducing the amount of carbon containing resist debris thereon by at least about 90%.

DISCLOSURE OF INVENTION

The present invention involves improving the processing of a resist by reducing undesirable debris on the resist stripped substrate. The present invention more specifically involves contacting the resist stripped substrate with ozone which, in turn, effectively reduces the amount of resist debris on the on the resist stripped substrate at the termination of lithographic processing.

During lithography, a resist is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The resist is provided over at least a portion of the substrate, but typically over the entire substrate.

Any carbon containing resist may be applied to the substrate surface by any suitable means. Carbon containing resists include organic photoresists. For example, a 157 nm photoresist, a 193 nm photoresist, a 13 nm photoresist, an 11 nm photoresist, an I-line, H-line, G-line, E-line, deep UV, extreme UV, X-ray resist, electron beam resist or chemically amplified photoresist material may be spin-coated on the substrate surface. Spin-coating involves depositing the resist in a solution over a spinning substrate. The centrifugal forces of the spinning substrate serve to evenly distribute the resist over the substrate.

Positive or negative resists may be used, but positive resists are preferred. Resists are commercially available from a number of sources, including Shipley Company, DuPont, Arch Chemical, Aquamer, Hunt, Hoechst Celanese Corporation, Clariant, JSR Microelectronics, and Brewer. The resist is typically applied to a thickness from about 2,000 Å to about 30,000 Å, although the thickness of the resist is not critical to the invention.

Optionally after the resist is applied to the substrate surface, the resist covered substrate is subjected to a soft bake to drive off excess solvent and/or to increase adhesion with the substrate surface. The soft bake involves heating at an elevated temperature for a suitable period of time.

The resist covered substrate is selectively exposed to actinic radiation or electron beams to cause a chemical transformation in desired regions of the resist. The wavelength of radiation is not critical to the invention, as it depends primarily upon the identity of the resist material. A mask is typically employed to selectively expose the resist.

The selectively exposed resist is developed using a suitable developer, such as an aqueous developer. The specific identity of the developer is not critical to the invention, but typically an aqueous alkaline solution is employed. For example, aqueous tetramethylammonium hydroxide is employed as a developer solution. The developer solution is deposited over a spinning resist clad substrate. The spinning action serves to uniformly spread the developer over and then off of the resist clad substrate.

During development, either the exposed portion of the resist (in embodiments where a positive resist is employed) or the unexposed portion of the resist (in embodiments where a negative resist is employed) is soluble or is solubilized in the developing solution. The portion of the resist that is not substantially soluble in the developing solution remains on the substrate. Development results in a patterned resist (the remaining portion of the resist) over the substrate surface. Various semiconductor processing is performed, taking advantage of the patterned resist. In particular, materials may be deposited over the patterned resist covered substrate surface, exposed areas of the substrate surface may be etched, or exposed areas of the substrate surface may be doped or otherwise treated.

After semiconductor processing is completed, the patterned resist is removed or stripped from the substrate using any suitable means. Stripping typically involves contacting the patterned resist with a stripper solution, such as a strong hydroxide solution, or a plasma stripper, such as oxygen plasma. Common strippers, in addition to those mentioned above, include alkanolamines and amines.

Stripping a resist from a substrate surface often results in a debris covered substrate surface. Resist stripping debris are typically carbon containing debris. Carbon containing debris, if not removed from the substrate surface, can lead to problems in subsequent semiconductor processing. This is because such debris cover/protect specific areas of the substrate where coverage/protection is not desired. Alternatively or additionally, such debris can contaminate layers/areas of the substrate.

Ozone is contacted with the resist developed and stripped semiconductor substrate in any suitable manner. While not wishing to be bound by any theory, it is believed that the ozone oxidizes resist debris, which can then be removed through the air. For instance, ozone can oxidize carbon containing resist debris into carbon dioxide, which can be removed by vacuum or an exhaust. The amount of ozone is primarily dependent upon the amount of resist debris on the semiconductor surface.

It is noted that contacting the resist developed and stripped semiconductor substrate with the ozone is not stripping the resist from the substrate. Contacting the resist developed and stripped semiconductor substrate with the ozone in accordance with the invention occurs after the patterned resist is stripped from the substrate. In this connection, the conditions and methods set forth herein are suited for debris reduction from a stripped substrate, not necessarily for patterned resist stripping. In fact, the conditions and methods using ozone set forth herein may not be well suited for stripping a patterned resist from a substrate. The actions of patterned resist stripping and resist debris reduction are separate and distinct.

After stripping, the resist stripped substrate may be rinsed prior to contact with ozone. Rinsing typically involves contacting the resist stripped substrate with deionized water. Alternatively or additionally, the resist stripped substrate may be rinsed with deionized water after contact with ozone.

In one embodiment, the ozone contacted with the resist developed and stripped semiconductor substrate is in the form of a plasma. In another embodiment, the ozone contacted with the resist developed and stripped semiconductor substrates is in the form of a gas. In yet another embodiment, the ozone contacted with the resist developed and stripped semiconductor substrates is in the form of a mixture of a plasma and a gas.

The ozone plasma/gas may be derived from any suitable ozone source. For example, ozone may be derived from oxygen using an ozone generator. Methods of making ozone are known in the art.

The ozone is preferably contacted with the resist developed and stripped semiconductor substrate as soon as possible after the resist is stripped from the substrate. However, time may elapse after development and before contact with ozone. For example, the resist developed and stripped semiconductor substrate is contacted by ozone within about one hour after the resist is stripped. In another embodiment, the resist developed and stripped semiconductor substrate is contacted by ozone within about 10 minutes after the resist is stripped.

Ozone is contacted with the resist developed and stripped semiconductor substrate for a time sufficient for the ozone to reduce, minimize and/or eliminate resist debris on the substrate surface. The time of which the ozone is contacted with the resist developed and stripped semiconductor substrate is typically from about 1 second to about 1 hour. In another embodiment, the ozone is contacted with the resist developed and stripped semiconductor substrate for a period of time from about 5 seconds to about 10 minutes. In yet another embodiment, the ozone is contacted with the resist developed and stripped semiconductor substrate for a period of time from about 10 seconds to about 2 minutes.

In one embodiment, the plasma/gas containing ozone further contains at least one inert gas, such as nitrogen, and the noble gases. Noble gases include argon, helium, neon, krypton, and xenon. In one embodiment where a plasma is employed, the plasma contains from about 10 sccm to about 10 slm of ozone and from about 0 sccm to about 10 slm of at least one inert gas. In another embodiment, the plasma contains from about 25 sccm to about 5 slm of ozone and from about 10 sccm to about 10 slm of at least one inert gas. In yet another embodiment, the plasma contains from about 50 sccm to about 1 slm of ozone and from about 25 sccm to about 5 slm of at least one inert gas.

In one embodiment where a gas is employed, the gas contains from about 1% to about 100% by weight of ozone and from about 0% to about 99% by weight of at least one inert gas. In another embodiment, the gas contains from about 3% to about 95% by weight of ozone and from about 5% to about 97% by weight of at least one inert gas. In yet another embodiment, the gas contains from about 5% to about 90% by weight of ozone and from about 10% to about 95% by weight of at least one inert gas.

In one embodiment, the ozone plasma or gas does not contain water. In another embodiment, the ozone plasma or gas does not contain oxygen. In yet another embodiment, the ozone plasma or gas does not contain a peroxide. In this connection, in one embodiment, the ozone plasma or gas consists essentially of ozone and optionally at least one inert gas.

Any suitable pressure may be employed when using the ozone containing plasma or gas. In one embodiment, the pressure in the processing chamber is from about 0.0001 Torr to about 1,000 Torr when using a plasma. In another embodiment, the pressure in the processing chamber is from about 0.001 Torr to about 500 Torr when using a plasma. In one embodiment, the pressure in the processing chamber is from about 10 Torr to about 1,500 Torr when using a gas. In another embodiment, the pressure in the processing chamber is from about 25 Torr to about 1,000 Torr when using a gas.

The temperature during contact between the ozone and resist developed and stripped semiconductor substrate is typically from about 10° C. to about 500° C. In one embodiment, the temperature during contact between the ozone and resist developed and stripped semiconductor substrate is from about 20° C. to about 400° C. In another embodiment, the temperature during contact between the ozone and resist developed and stripped semiconductor substrate is from about 30° C. to about 300° C. The temperature is maintained to maximize the reduction of resist debris on the resist developed and stripped semiconductor substrate, while not substantially damaging or degrading the substrate surface.

Comparing the substrate surface before and after contact with ozone, the substrate surface after contact has at least about 75% less carbon containing debris (for example, by weight) than the substrate surface before contact. In another embodiment, the substrate surface after contact has at least about 90% less carbon containing debris than the substrate surface before contact. In yet another embodiment, the substrate surface after contact has at least about 98% less carbon containing debris than the substrate surface before contact. In still yet another embodiment, the substrate surface after contact has no detectable carbon containing debris.

Once the debris are oxidized, they can be removed from the processing chamber by vacuum, exhaust, or other suitable means. In instances where carbon containing debris are oxidized into carbon dioxide, a vacuum or exhaust is particularly effective in removing such materials.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor structure, comprising:
   providing the semiconductor structure having a patterned resist thereon;
   stripping the patterned resist from the semiconductor structure by contacting the patterned resist and semiconductor structure with a stripper selected from the group consisting of a hydroxide solution, an alkanolamine, and an amine wherein an amount of carbon containing resist debris remain on the semiconductor structure; and
   contacting the semiconductor structure with plasma comprising ozone in an amount from about 25 sccm to about 5 slm thereby reducing the amount of carbon containing resist debris by at least about 75% by weight.

2. The method of claim 1, wherein the patterned resist comprises an organic photoresist.

3. The method of claim 1, wherein the patterned resist comprises one of a 157 nm photoresist, a 193 nm photoresist, a 13 nm photoresist, an 11 nm photoresist, an I-line, an H-line, a G-line, an E-line, a deep UV, an extreme UV, an X-ray resist, an electron beam resist or a chemically amplified photoresist material.

4. The method of claim 1, wherein the ozone plasma is contacted with the semiconductor structure under a pressure from about 0.0001 Torr to about 1,000 Torr.

5. The method of claim 1, wherein the semiconductor structure is contacted with a plasma comprising ozone within about 10 minutes after stripping the patterned resist from the semiconductor structure.

6. A method of reducing carbon containing resist debris on a patterned resist stripped semiconductor, comprising:
   providing a semiconductor structure having a patterned resist thereon, the patterned resist comprising a carbon containing material;
   stripping the patterned resist from the semiconductor structure by contacting the patterned resist and semiconductor structure with a stripper selected from the group consisting of a hydroxide solution, an alkanolamine, and an amine, wherein an amount of carbon containing resist debris remain on the semiconductor structure;

contacting the patterned resist stripped semiconductor structure with a gas comprising ozone and at least one inert gas thereby reducing the amount of carbon containing resist debris thereon by at least about 75% by weight; and rinsing the semiconductor structure.

7. The method of claim 6, wherein the inert gas is at least one of nitrogen, argon, helium, neon, krypton, and xenon.

8. The method of claim 6, wherein the patterned resist stripped semiconductor structure is contacted with a gas comprising from about 3% to about 95% by weight of ozone and from about 5% to about 97% by weight of at least one inert gas.

9. The method of claim 6, wherein the patterned resist stripped semiconductor structure is contacted with the gas comprising ozone and at least one inert gas within about 10 minutes after stripping.

10. The method of claim 6, wherein the patterned resist stripped semiconductor structure is contacted with a gas comprising from about 5% to about 90% by weight of ozone and from about 10% to about 95% by weight of at least one inert gas.

11. The method of claim 6, wherein the semiconductor structure is rinsed with deionized water.

12. The method of claim 6, wherein the semiconductor structure after contact with the gas has at least about 90% less carbon containing debris than the semiconductor structure before contact.

13. The method of claim 6, wherein the semiconductor structure is contacted with a gas comprising ozone and at least one inert gas within about 1 hour after stripping the patterned resist from the semiconductor structure.

14. A method of processing a semiconductor structure, comprising:

providing the semiconductor structure having a patterned resist thereon, the patterned resist comprising a carbon containing material;

stripping the patterned resist from the semiconductor structure by contacting the patterned resist and semiconductor structure with a stripper selected from the group consisting of a hydroxide solution, an alkanolamine, and an amine, wherein an amount of carbon containing resist debris remain on the semiconductor structure; and contacting the semiconductor structure with a plasma consisting essentially of from about 25 sccm to about 5 slm ozone and from about 10 sccm to about 10 slm of at least one inert gas selected from nitrogen, helium, or argon thereby reducing the amount of carbon containing resist debris thereon by at least about 90% by weight within about 1 hour after stripping the patterned resist from the semiconductor structure.

15. The method of claim 14, wherein the patterned resist stripped semiconductor structure is contacted with a plasma comprising from about 50 sccm to about 1 slm of ozone and from about 25 sccm to about 5 slm of at least one inert gas.

16. The method of claim 14, wherein the patterned resist stripped semiconductor structure is contacted with the plasma comprising ozone and at least one inert gas within about 10 minutes after stripping.

17. The method of claim 14, wherein the inert gas is nitrogen or argon.

18. The method of claim 14, wherein the semiconductor structure is contacted with a plasma within about 10 minutes after stripping the patterned resist from the semiconductor structure.

* * * * *